United States Patent
Radosavljevic et al.

(10) Patent No.: US 10,879,134 B2
(45) Date of Patent: Dec. 29, 2020

(54) TECHNIQUES FOR MONOLITHIC CO-INTEGRATION OF SILICON AND III-N SEMICONDUCTOR TRANSISTORS

(71) Applicant: INTEL CORPORATION, Santa Clara, CA (US)

(72) Inventors: Marko Radosavljevic, Portland, OR (US); Han Wui Then, Portland, OR (US); Sansaptak Dasgupta, Hillsboro, OR (US); Peter G. Tolchinsky, Beaverton, OR (US)

(73) Assignee: INTEL Corporation, Santa Clara, CA (US)

( * ) Notice: Subject to any disclaimer, the term of this patent is extended or adjusted under 35 U.S.C. 154(b) by 0 days.

(21) Appl. No.: 16/302,414

(22) PCT Filed: Jun. 22, 2016

(86) PCT No.: PCT/US2016/038627
§ 371 (c)(1),
(2) Date: Nov. 16, 2018

(87) PCT Pub. No.: WO2017/222513
PCT Pub. Date: Dec. 28, 2017

(65) Prior Publication Data
US 2019/0279908 A1 Sep. 12, 2019

(51) Int. Cl.
*H01L 21/8258* (2006.01)
*H01L 21/02* (2006.01)
(Continued)

(52) U.S. Cl.
CPC ...... *H01L 21/8258* (2013.01); *H01L 21/0254* (2013.01); *H01L 21/02381* (2013.01);
(Continued)

(58) Field of Classification Search
CPC .......... H01L 21/2007; H01L 21/76254; H01L 21/8258; H01L 21/02381; H01L 21/02532;
(Continued)

(56) References Cited

U.S. PATENT DOCUMENTS

2006/0220129 A1  10/2006  Letertre et al.
2006/0284247 A1*  12/2006  Augustine ........... H01L 21/8258
                                            257/338
(Continued)

FOREIGN PATENT DOCUMENTS

JP  2006512748 A  4/2006
WO  2015103976 A1  7/2015
(Continued)

OTHER PUBLICATIONS

International Search Report and Written Opinion received for PCT Application No. PCT/US2016/038627, dated Mar. 15, 2017. 15 pages.
(Continued)

*Primary Examiner* — Ermias T Woldegeorgis
(74) *Attorney, Agent, or Firm* — Finch & Maloney PLLC

(57) ABSTRACT

Techniques are disclosed for monolithic co-integration of silicon (Si)-based transistor devices and III-N semiconductor-based transistor devices over a commonly shared semiconductor substrate. In accordance with some embodiments, the disclosed techniques may be used to provide a silicon-on-insulator (SOI) or other semiconductor-on-insulator structure including: (1) a Si (111) surface available for formation of III-N-based n-channel devices; and (2) a Si (100) surface available for formation of Si-based p-channel devices, n-channel devices, or both. Further processing may be performed, in accordance with some embodiments, to provide n-channel and p-channel devices over the Si (111)
(Continued)

and Si (100) surfaces, as desired. In accordance with some embodiments, the disclosed techniques may be used to provide co-integrated III-N-based n-type metal-oxide-semiconductor (NMOS) devices and Si-based p-type metal-oxide-semiconductor (PMOS), NMOS, or complementary MOS (CMOS) devices with different step heights or with a given degree of co-planarity, as desired for a given target application or end-use.

20 Claims, 7 Drawing Sheets

(51) Int. Cl.
*H01L 27/12* (2006.01)
*H01L 29/04* (2006.01)
*H01L 29/08* (2006.01)
*H01L 29/16* (2006.01)
*H01L 29/20* (2006.01)
*H01L 27/092* (2006.01)
*H01L 27/06* (2006.01)
*H01L 29/66* (2006.01)
*H01L 21/762* (2006.01)
*H01L 21/8238* (2006.01)

(52) U.S. Cl.
CPC .. *H01L 21/02532* (2013.01); *H01L 21/02609* (2013.01); *H01L 27/0605* (2013.01); *H01L 27/092* (2013.01); *H01L 27/1207* (2013.01); *H01L 29/045* (2013.01); *H01L 29/0847* (2013.01); *H01L 29/16* (2013.01); *H01L 29/2003* (2013.01); *H01L 21/76254* (2013.01); *H01L 21/823807* (2013.01); *H01L 29/66522* (2013.01); *H01L 29/66545* (2013.01); *H01L 29/66568* (2013.01); *H01L 29/66628* (2013.01)

(58) Field of Classification Search
CPC .......... H01L 21/0254; H01L 21/02609; H01L 29/045; H01L 29/0847; H01L 29/16; H01L 29/2003; H01L 27/092; H01L 27/0605

See application file for complete search history.

(56) References Cited

U.S. PATENT DOCUMENTS

2006/0292770 A1* 12/2006 Wu .................. H01L 21/84
438/187
2013/0270608 A1 10/2013 Bayram et al.

FOREIGN PATENT DOCUMENTS

WO WO-2015103976 A1 * 7/2015
WO 2017222513 A1 12/2017

OTHER PUBLICATIONS

International Preliminary Report on Patentability received for PCT Application No. PCT/US2016/038627, dated Jan. 3, 2019. 12 pages.

* cited by examiner

TECHNIQUES FOR MONOLITHIC CO-INTEGRATION OF SILICON AND III-N SEMICONDUCTOR TRANSISTORS

BACKGROUND

Power amplifiers, voltage regulators, and other wireless communication and power management devices can utilize solid-state transistor devices. A field-effect transistor (FET) is a semiconductor device that includes three terminals: a gate, a source, and a drain. Through application of an electric field produced by the gate, the electrical conductivity of a nearby semiconductor channel may be controlled in a manner that allows charge carriers, such as electrons or holes, to flow between the source and drain. In instances where the charge carriers are electrons, the FET is referred to as an n-channel device. In instances where the charge carriers are holes, the FET is referred to as a p-channel device. Some FETs have a fourth terminal known as the body or substrate, which can be used to bias the transistor. A metal-oxide-semiconductor FET (MOSFET) is typically configured with an insulator between the gate and the body of the transistor, and MOSFETs are commonly used for amplifying or switching electronic signals. Complementary MOS (CMOS) devices use a combination of p-channel MOS (PMOS) and n-channel MOS (NMOS) devices to implement logic gates and other digital circuits.

Figure 1A:
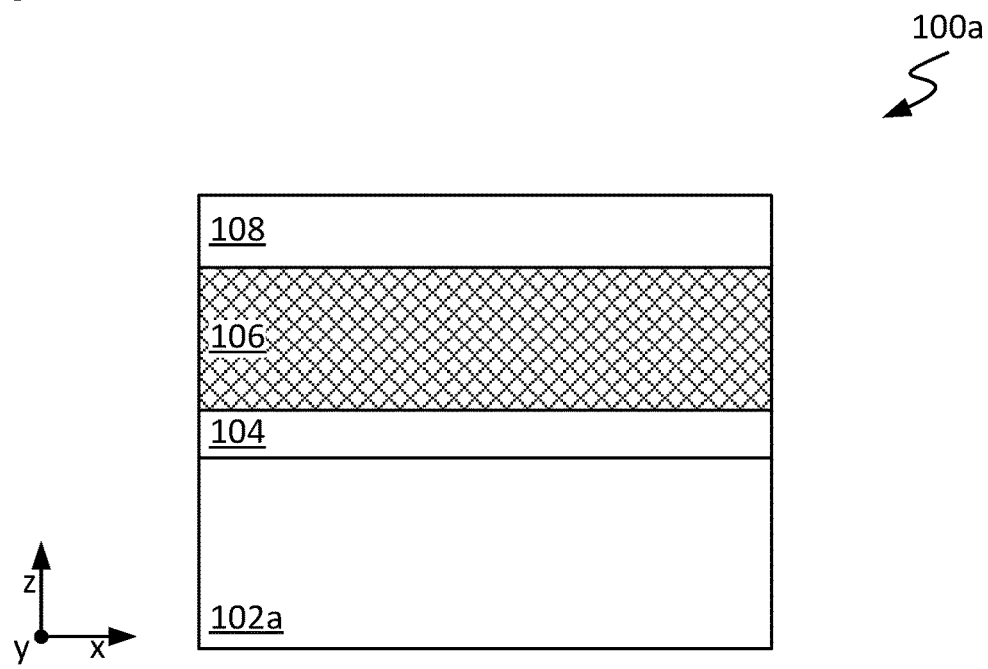
FIGS. 1A-1F illustrate a process flow for forming an integrated circuit (IC) in accordance with an embodiment of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Techniques are disclosed for monolithic co-integration of silicon (Si)-based transistor devices and III-N semiconductor-based transistor devices over a commonly shared semiconductor substrate. In accordance with some embodiments, the disclosed techniques may be used to provide a silicon-on-insulator (SOI) or other semiconductor-on-insulator structure including: (1) a Si (111) surface available for formation of III-N-based n-channel devices; and (2) a Si (100) surface available for formation of Si-based p-channel devices, n-channel devices, or both. Further processing may be performed, in accordance with some embodiments, to provide n-channel and p-channel devices over the Si (111) and Si (100) surfaces, as desired. In accordance with some embodiments, the disclosed techniques may be used to provide co-integrated III-N-based n-type metal-oxide-semiconductor (NMOS) devices and Si-based p-type metal-oxide-semiconductor (PMOS), NMOS, or complementary MOS (CMOS) devices with different step heights or with a given degree of co-planarity, as desired for a given target application or end-use. Numerous configurations and variations will be apparent in light of this disclosure.

General Overview

Power delivery and radio frequency (RF) communications applications typically employ logic and controller circuits that tend to work best when implemented with high-performance, low-leakage p-channel transistor devices. Gallium nitride (GaN) has a very high bandgap and simultaneously high mobility and is thus suitable for n-channel transistor devices typically implemented in voltage regulators (VRs) and other power management integrated circuits (PMICs), as well as RF power amplifiers (PAs). However, GaN is not particularly adequate for use in the p-channel transistor devices of such logic and controller circuitry. Although the p-channel can be implemented with an alternative material such as silicon (Si), processing difficulties may arise because GaN growth normally employs a Si (111) surface orientation (rather than a Si (100) surface orientation) and there may be a significant step height difference between relatively thick GaN layers and the underlying Si substrate.

Thus, and in accordance with some embodiments of the present disclosure, techniques are disclosed for monolithic co-integration of Si-based transistor devices and III-N semiconductor-based transistor devices over a commonly shared Si or other semiconductor substrate. In accordance with some embodiments, the disclosed techniques may be used to provide a SOI or other semiconductor-on-insulator structure including: (1) a Si (111) surface over which III-N-based n-channel devices may be formed; and (2) a Si (100) surface over which Si-based p-channel devices, n-channel devices, or both, may be formed. Further processing may be performed, in accordance with some embodiments, to provide such n-channel and p-channel devices over the available Si (111) and Si (100) surfaces. In accordance with some embodiments, the disclosed techniques may be used to provide III-N-based NMOS devices and Si-based PMOS, NMOS, or complementary MOS (CMOS) devices with different step heights or with a given degree of co-planarity, as desired for a given target application or end-use.

In accordance with some embodiments, a lightly p-doped (p) epitaxial Si (100) layer may be formed over a Si (100) substrate. Then, a buried oxide (BOX) layer may be formed over the p⁻ epitaxial Si (100) layer, and a Si (111) layer may be transferred to the BOX layer from a carrier substrate. Thereafter, in some cases, a III-N semiconductor layer may be formed over the Si (111) layer (optionally with an intervening nucleation layer), and then the Si (111) layer and BOX layer may be partially removed so as to expose a first portion of the p⁻ epitaxial Si (100) layer. In some alternative cases, the Si (111) layer and BOX layer may be partially removed so as to expose the first portion of the p⁻ epitaxial Si (100) layer, and then the III-N semiconductor layer may be formed over the Si (111) layer (optionally with an intervening nucleation layer). In either instance, the III-N semiconductor layer may be disposed over a second portion of the p⁻ epitaxial Si (100) layer that is different from the first portion. Thereafter, Si p-channel or n-channel device(s) (or both) may be formed over the first portion of the p⁻ epitaxial Si (100) layer, and III-N semiconductor device(s) may be formed over the III-N semiconductor layer disposed over the second portion of the p⁻ epitaxial Si (100) layer.

In accordance with some other embodiments, a BOX layer may be formed over a Si (111) substrate. Then, a Si (100) layer and a p⁻ epitaxial Si (100) layer may be transferred to the BOX layer from a carrier substrate. Then, the Si (100) layer and BOX layer may be partially removed so as to expose a first portion of the Si (111) substrate, and a III-N semiconductor layer may be formed over that first portion (optionally with an intervening nucleation layer). Thereafter, Si p-channel or n-channel device(s) (or both) may be formed over the Si (100) layer so as to be disposed over a second portion of the Si (111) substrate that is different from the first portion, and III-N semiconductor device(s) may be formed over the III-N semiconductor layer disposed over the first portion of the Si (111) substrate.

In accordance with some embodiments, the different crystallographic surface orientations made available by a given structure provided as described herein may be configured to cater to both high-performance, high-voltage GaN (or other III-N) NMOS and Si PMOS, NMOS, or CMOS devices. In accordance with some embodiments, in using the disclosed techniques, co-integration of complete PMIC or RF frontend circuits that include both p-channel and n-channel devices may be permitted to proceed on separate portions of a Si wafer or other semiconductor substrate. In a more general sense, a first area of a semiconductor substrate may be designated for a Si p-channel device, whereas a second, different area of the semiconductor substrate may be designated for a GaN or other III-N n-channel device, in accordance with some embodiments. In some instances, the Si device area and the III-N device area may be at different step heights (e.g., depending on which initial SOI or other semiconductor-on-insulator structure is implemented), as well as on the thicknesses of different constituent layers, such as the III-N semiconductor layer(s) and BOX layer(s), among others. As will be appreciated in light of this disclosure, a co-integration scheme provided via the techniques disclosed herein may account for the thermal budget of each layer present, allowing III-N processing (e.g., which may involve formation temperatures in excess of 1,000° C.) to proceed before Si processing.

In accordance with some embodiments, the disclosed techniques may be used, for example, to provide monolithic co-integration of Si PMOS (or NMOS or CMOS) and III-N-based NMOS over different crystal planes of a SOI or other semiconductor-on-insulator structure. In accordance with some embodiments, the disclosed techniques may be used, for example, in providing high-performance VR circuits, RF frontend devices, and other system-on-chip (SoC) products in GaN that are monolithically co-integrated with Si or any other PMOS.

In accordance with some embodiments, the disclosed techniques may be used, for example, in providing SOI or other semiconductor-on-insulator structures which provide opportunities for substrate choice and layer formation based, at least in part, on operation requirements or other target performance parameters of RF and PMIC devices to be formed. For instance, it may be desirable to maximize or otherwise provide high resistivity (e.g., on the order of about 1 kΩ·cm) for GaN-based RF devices, whereas it may be desirable to minimize or otherwise provide low resistivity (e.g., on the order of about 10 Ω·cm) to allow for tuning of doping schemes for logic devices. To these ends, the disclosed techniques may be used, for example, in a manner allowing for optimizing or otherwise customizing resistivity for a given target application or end-use, in accordance with some embodiments.

As discussed herein, the disclosed techniques may involve transferring one or more semiconductor layers from a carrier substrate to a layer stack disposed over a semiconductor substrate, in accordance with some embodiments. As will be appreciated in light of this disclosure, this provides an opportunity for intentionally varying the alignment of the alignment notch of the carrier substrate with respect to the alignment notch of the semiconductor substrate. In accordance with some embodiments, intentionally placing the semiconductor substrate and a given overlying semiconductor layer in different notch alignment may allow for customizing device performance and epitaxial layer growth capabilities. For example, use of the disclosed techniques may provide opportunities for Si (100) and Si (111) to be notch-aligned in a given manner to provide optimal (or other desired) transport for Si PMOS (or NMOS or CMOS) and III-N NMOS formation.

In accordance with some embodiments, use of the disclosed techniques may be detected, for example, by any one, or combination, of scanning electron microscopy (SEM), transmission electron microscopy (TEM), chemical composition analysis, energy-dispersive X-ray (EDX) spectroscopy, and secondary ion mass spectrometry (SIMS) of a given IC or other transistor structure having PMOS or NMOS (or both) devices formed over a semiconductor layer of a first crystallographic orientation, which in turn is disposed over a semiconductor substrate of a second, different crystallographic orientation.

Methodologies and Structure

FIGS. 1A-1F illustrate a process flow for forming an integrated circuit (IC) 100a in accordance with an embodiment of the present disclosure. As can be seen from FIG. 1F in particular and as discussed below, this process flow may be used, for example, to fabricate an IC 100a including a CMOS transistor device 120a (e.g., Si PMOS, NMOS, or both) and an NMOS transistor device 120b (e.g., III-N semiconductor NMOS) over a commonly shared semiconductor substrate, in accordance with some embodiments. As will be appreciated in light of this disclosure, in some cases, the process flow of FIGS. 1A-1F may result in a step height difference between CMOS transistor device 120a and NMOS transistor device 120b, as generally can be seen from FIG. 1F.

The process flow may begin as in FIG. 1A, which illustrates a cross-sectional view of an IC 100a configured in accordance with an embodiment of the present disclosure. As can be seen, IC 100a may include a semiconductor substrate 102a, which may have any of a wide range of configurations. For instance, semiconductor substrate 102a may be configured as any one, or combination, of a bulk semiconductor substrate, a silicon-on-insulator (SOI) or other semiconductor-on-insulator structure (XOI, where X represents a semiconductor material, such as silicon, germanium, germanium-enriched silicon, and so forth), a semiconductor wafer, and a multi-layered semiconductor structure. In accordance with some embodiments, semiconductor substrate 102a may be comprised of any one, or combination, of semiconductor materials, such as silicon (Si), germanium (Ge), and silicon-germanium (SiGe), among others. In some embodiments, semiconductor substrate 102a may be comprised of Si having a crystallographic orientation of (100). Other suitable materials and configurations for semiconductor substrate 102a will depend on a given application and will be apparent in light of this disclosure.

Also, as can be seen from FIG. 1A, IC 100a may include a semiconductor layer 104 disposed over semiconductor substrate 102a. In some cases, semiconductor layer 104 may be disposed directly on semiconductor substrate 102a with no layers intervening, whereas in some other cases, one or more intervening layers may be disposed between semiconductor layer 104 and semiconductor substrate 102a. In a more general sense, semiconductor layer 104 may be disposed superjacent to semiconductor substrate 102a, optionally with one or more intervening layers, in accordance with some embodiments.

As will be appreciated in light of this disclosure, semiconductor layer 104 may be comprised of any of the example materials discussed above, for instance, with respect to semiconductor substrate 102a, in accordance with some embodiments. In some cases, semiconductor layer 104 and semiconductor substrate 102a may be comprised of the same semiconductor materials (e.g., both semiconductor layer 104 and semiconductor substrate 102a may be comprised of Si), whereas in some other cases, semiconductor layer 104 and semiconductor substrate 102a may differ in material composition. In some embodiments, semiconductor layer 104 may have a crystallographic orientation of (100), though in other embodiments, other crystallographic orientations may be provided. In some instances, semiconductor layer 104 may be of the same crystallographic orientation as semiconductor substrate 102a, whereas in other instances, semiconductor layer 104 and semiconductor substrate 102a may be of different crystallographic orientations.

In accordance with some embodiments, semiconductor layer 104 may be doped to a conductivity type and dopant concentration desired for a given target application or end-use. For instance, semiconductor layer 104 may be doped, in accordance with some embodiments, with a p-type dopant, such as boron (B) or gallium (Ga). In some cases, semiconductor layer 104 may be doped so as to have an electrical resistivity in the range of about 5-15 Ω·cm (e.g., about 5-10 Ω·cm, about 10-15 Ω·cm, or any other sub-range in the range of about 5-15 Ω·cm). In an example case, semiconductor layer 104 may be a lightly p-doped (e.g., p) epitaxial Si layer. In accordance with some embodiments, semiconductor layer 104 may serve to decouple doping of one or more overlying device layers from underlying semiconductor substrate 102a.

Semiconductor layer 104 may be formed over semiconductor substrate 102a via any suitable standard, custom, or proprietary technique(s), as will be apparent in light of this disclosure. In accordance with some embodiments, semiconductor layer 104 may be formed via any one, or combination, of a chemical vapor deposition (CVD) process (e.g., low-pressure CVD, or LPCVD) and a molecular beam epitaxy (MBE) process, among others.

The thickness (e.g., z-thickness in the z-direction) of semiconductor layer 104 may be customized, as desired for a given target application or end-use. In some cases, semiconductor layer 104 may have a z-thickness in the range of about 0.1-2.0 μm (e.g., about 0.1-0.5 μm, about 0.5-1.0 μm, about 1.0-1.5 μm, about 1.5-2.0 μm, or any other sub-range in the range of about 0.1-2.0 μm). Other suitable materials, doping schemes, formation techniques, configurations, and dimensions for semiconductor layer 104 will depend on a given application and will be apparent in light of this disclosure.

As can be seen further from FIG. 1A, IC 100a may include an insulator layer 106 disposed over semiconductor layer 104. In some cases, insulator layer 106 may be disposed directly on semiconductor layer 104 with no layers intervening, whereas in some other cases, one or more intervening layers may be disposed between insulator layer 106 and semiconductor layer 104. In a more general sense, insulator layer 106 may be disposed superjacent to semiconductor layer 104, optionally with one or more intervening layers, in accordance with some embodiments.

Insulator layer 106 may be comprised of any one, or combination, of a wide range of insulator or dielectric materials. For instance, in some embodiments, insulator layer 106 may be formed from an oxide, such as silicon dioxide ($SiO_2$) or carbon-doped oxide (CDO). In some instances, insulator layer 106 may be considered, in a general sense, a buried oxide (BOX) layer. In some embodiments, insulator layer 106 may be formed from a nitride, such as silicon nitride ($Si_3N_4$). In some embodiments, insulator layer 106 may be formed from a carbide, such as silicon carbide (SiC). In some embodiments, insulator layer 106 may be formed from an oxynitride, such as silicon oxynitride (SiON) or carbon-doped SiON.

Insulator layer 106 may be formed via any suitable standard, custom, or proprietary technique(s), as will be apparent in light of this disclosure. In accordance with some embodiments, insulator layer 106 may be formed via any one, or combination, of a chemical vapor deposition (CVD) process (e.g., plasma-enhanced CVD, or PECVD) and an atomic layer deposition (ALD) process, among others.

The thickness (e.g., z-thickness in the z-direction) of insulator layer 106 may be customized, as desired for a given target application or end-use. In some cases, insulator layer 106 may have a z-thickness in the range of about 10 nm-1 μm (e.g., about 10-250 nm, about 250-500 nm, about 500-750 nm, about 750 nm-1 μm, or any other sub-range in the range of about 10 nm-1 μm). As will be appreciated in light of this disclosure, it may be desirable, at least in some instances, to provide an insulator layer 106 of sufficient thickness to ensure that it is sufficiently electrically non-leaky for IC 100a. Other suitable materials, formation techniques, configurations, and dimensions for insulator layer 106 will depend on a given application and will be apparent in light of this disclosure.

Also, as can be seen from FIG. 1A, IC 100a may include a semiconductor layer 108 disposed over insulator layer 106. In some cases, semiconductor layer 108 may be disposed directly on insulator layer 106 with no layers intervening, whereas in some other cases, one or more intervening layers may be disposed between semiconductor layer 108 and insulator layer 106. In a more general sense, semiconductor layer 108 may be disposed superjacent to insulator layer 106, optionally with one or more intervening layers, in accordance with some embodiments.

As will be appreciated in light of this disclosure, semiconductor layer 108 may be comprised of any one, or combination, of the example semiconductor materials discussed above, for instance, with respect to semiconductor substrate 102a, in accordance with some embodiments. In some cases, semiconductor layer 108 and semiconductor substrate 102a may be comprised of the same semiconductor materials (e.g., both semiconductor layer 108 and semiconductor substrate 102a may be comprised of Si), whereas in some other cases, semiconductor layer 108 and semiconductor substrate 102a may differ in material composition. In some embodiments, semiconductor layer 108 may have a crystallographic orientation of (111), though in other embodiments, other crystallographic orientations may be provided. In some instances, semiconductor layer 108 and semiconductor substrate 102a may be of different crystallographic orientation, for example, semiconductor layer 108 may have a crystallographic orientation of (111), and semiconductor substrate 102a may have a crystallographic orientation of (100).

Semiconductor layer 108 may be formed via any suitable standard, custom, or proprietary technique(s), as will be apparent in light of this disclosure. In accordance with some embodiments, semiconductor layer 108 may be transferred to IC 100a from a carrier substrate (e.g., carrier wafer). More particularly, in accordance with an embodiment, semiconductor layer 108 may be initially formed over a carrier substrate and then bonded with insulator layer 106 via any suitable standard, custom, or proprietary bonding technique(s), as will be apparent in light of this disclosure. Thereafter, in accordance with an embodiment, the carrier substrate may be separated from semiconductor layer 108, leaving behind semiconductor layer 108 as a portion of IC 100a. To that end, semiconductor layer 108 may be separated from the carrier substrate via ion cleaving by hydrogen-induced layer exfoliation other suitable exfoliation or layer separation process, as will be apparent in light of this disclosure. In accordance with an embodiment, before further processing, semiconductor layer 108 optionally may undergo planarization via a chemical-mechanical planarization (CMP) process or other suitable planarization process, as will be apparent in light of this disclosure.

The thickness (e.g., z-thickness in the z-direction) of semiconductor layer 108 may be customized, as desired for a given target application or end-use. In some cases, semiconductor layer 108 may have a z-thickness in the range of about 10 nm-100 nm (e.g., about 10-25 nm, about 25-50 nm, about 50-75 nm, about 75 nm-100 nm, or any other sub-range in the range of about 10 nm-100 nm). In some instances, the z-thickness may be adjusted based on the particular amount of strain desired as a result of the ratio between III-N semiconductor layer 110 (discussed below) and underlying semiconductor substrate 102a. Other suitable materials, formation techniques, configurations, and dimensions for semiconductor layer 108 will depend on a given application and will be apparent in light of this disclosure.

Figure 1B:
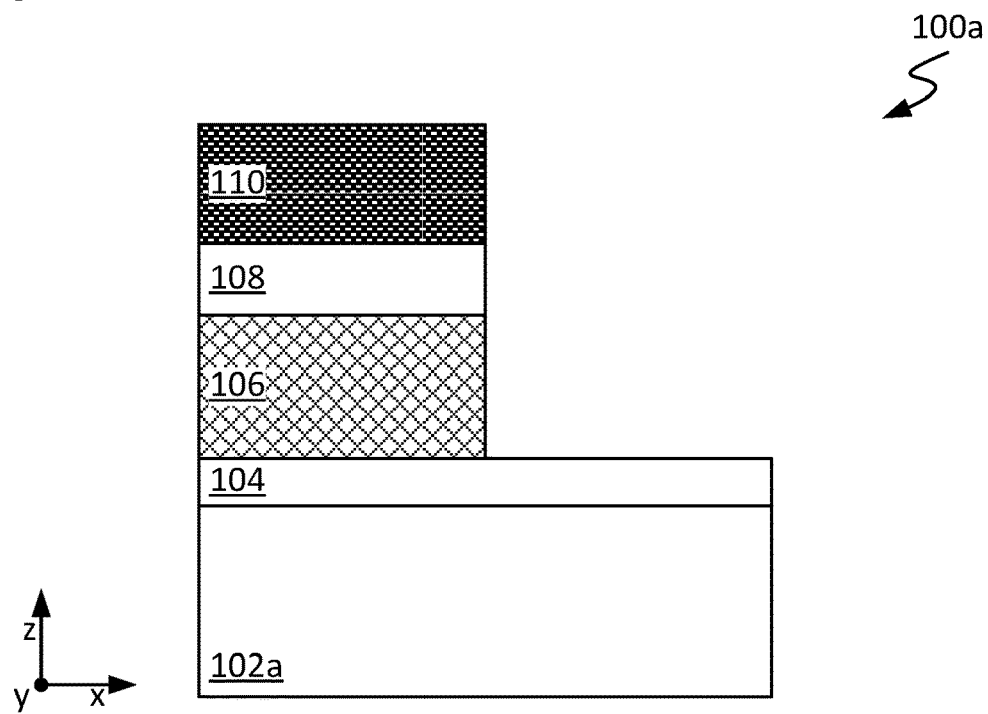

The process flow may continue as in FIG. 1B, which illustrates a cross-sectional view of the IC 100a of FIG. 1A after forming a III-N semiconductor layer 110, in accordance with an embodiment of the present disclosure. III-N semiconductor layer 110 may be disposed over semiconductor layer 108. In some cases, III-N semiconductor layer 110 may be disposed directly on semiconductor layer 108 with no layers intervening, whereas in some other cases, one or more intervening layers may be disposed between III-N semiconductor layer 110 and semiconductor layer 108. In a more general sense, III-N semiconductor layer 110 may be disposed superjacent to semiconductor layer 108, optionally with one or more intervening layers, in accordance with some embodiments.

In accordance with some embodiments, III-N semiconductor layer 110 may be comprised of any one, or combination, of III-N semiconductor materials, including gallium nitride (GaN), aluminum nitride (AlN), indium nitride (InN), indium gallium nitride (InGaN), aluminum gallium nitride (AlGaN), aluminum indium nitride (AlInN), and aluminum indium gallium nitride (AlInGaN).

III-N semiconductor layer 110 may be formed via any suitable standard, custom, or proprietary technique(s), as will be apparent in light of this disclosure. For instance, in accordance with some embodiments, III-N semiconductor layer 110 may be formed via any one, or combination, of a CVD process (e.g., metal-organic chemical vapor deposition, or MOCVD) and an epitaxy process (e.g., metal-organic vapor phase epitaxy, or MOVPE; molecular beam epitaxy, or MBE), among others. In accordance with some embodiments, III-N semiconductor layer 110 may be formed, in part or in whole, via a process involving shallow trench isolation (STI), patterning the STI with feature(s) of sufficient aspect ratio to provide aspect ratio trapping (ART) of defects, filling feature(s) of the patterned STI with III-N material, and performing epitaxial lateral overgrowth (ELO) of the III-N material over a topography of the STI layer. In accordance with some embodiments, III-N semiconductor layer 110 may be formed, in part or in whole, via a process involving a nucleation layer (discussed below).

In some embodiments, III-N semiconductor layer 110 may include one or more three-dimensional semiconductor structures, such as island-like semiconductor bodies or nanowire or nanoribbon semiconductor bodies, to name a few. In some embodiments, III-N semiconductor layer 110 may be configured as a single-layer structure, whereas in some other embodiments, III-N semiconductor layer 110 may be configured as a bi-layer, tri-layer, or other multi-layer structure. In some cases, III-N semiconductor layer 110 may be configured such that each of a first constituent layer and an immediately adjacent constituent layer (e.g., immediately superjacent and/or immediately subjacent) is comprised of the same III-N semiconductor material. In some other cases, III-N semiconductor layer 110 may be configured as a superlattice structure including alternating layers of III-N semiconductor materials. For instance, III-N semiconductor layer 110 may include a first constituent layer comprised of a first III-N semiconductor material and an immediately adjacent constituent layer (e.g., immediately superjacent and/or immediately subjacent) comprised of a different second III-N semiconductor material. In some such instances, the first and second constituent layers may be repeated in an alternating manner or other given desired order. Additional third, fourth, and further constituent layers optionally may be provided, in accordance with some embodiments. Numerous configurations and variations for III-N semiconductor layer 110 will be apparent in light of this disclosure.

The thickness (e.g., z-thickness in the z-direction) of III-N semiconductor layer 110 may be customized, as desired for a given target application or end-use. In some cases, III-N semiconductor layer 110 (or a given constituent layer or body thereof, in cases of a multi-layer or three-dimensional structure) may have a z-thickness in the range of about 1-5 μm (e.g., about 1-2.5 μm, about 2.5-5 μm, or any other sub-range in the range of about 1-5 μm). Other suitable materials, formation techniques, configurations, and dimensions for III-N semiconductor layer 110 will depend on a given application and will be apparent in light of this disclosure.

In some cases, a nucleation layer optionally may be formed over semiconductor layer 108, and III-N semiconductor layer 110 may be formed over that nucleation layer. When optionally included, such a nucleation layer may be comprised of any one, or combination, of suitable materials, such as aluminum nitride (AlN), aluminum gallium nitride (AlGaN), or an alloy of any thereof, to name a few. A given optional nucleation layer may be formed via any suitable standard, custom, or proprietary technique(s), as will be apparent in light of this disclosure. For instance, in accordance with some embodiments, a given optional nucleation layer may be formed via any one, or combination, of a molecular beam epitaxy (MBE) process and a metalorganic vapor phase epitaxy (MOVPE) process, among others. The thickness (e.g., z-thickness in the z-direction) of such a nucleation layer may be customized, as desired for a given target application or end-use. In some cases, a given optional nucleation layer may have a z-thickness in the range of about 50-300 nm (e.g., about 50-175 nm, about 175-300 nm, or any other sub-range in the range of about 50-300 nm). Other suitable materials, formation techniques, configurations, and dimensions for a given optional nucleation layer will depend on a given application and will be apparent in light of this disclosure.

As will be appreciated in light of this disclosure, there are several opportunities for when III-N semiconductor layer 110 may be formed in the context of the process flow of FIGS. 1A-1F. In accordance with some embodiments, semiconductor layer 108 and insulator layer 106 may be partially removed from IC 100a before forming III-N semiconductor layer 110 over semiconductor layer 108. In accordance with some other embodiments, III-N semiconductor layer 110 may be formed over semiconductor layer 108 before partially removing semiconductor layer 108 and insulator layer 106. In either case, the resultant IC 100a may include a stack of layers over semiconductor layer 104 including insulator layer 106, semiconductor layer 108, and III-N semiconductor layer 110, as generally can be seen from FIG. 1B. In accordance with some embodiments, partial removal of semiconductor layer 108 and insulator layer 106 materials may be provided via any suitable standard, custom, or proprietary lithography, etch, and clean process(es), as will be apparent in light of this disclosure. In partially removing semiconductor layer 108 and insulator layer 106, the surface of underlying semiconductor layer 104 may be exposed for further processing, as described herein.

Figure 1C:
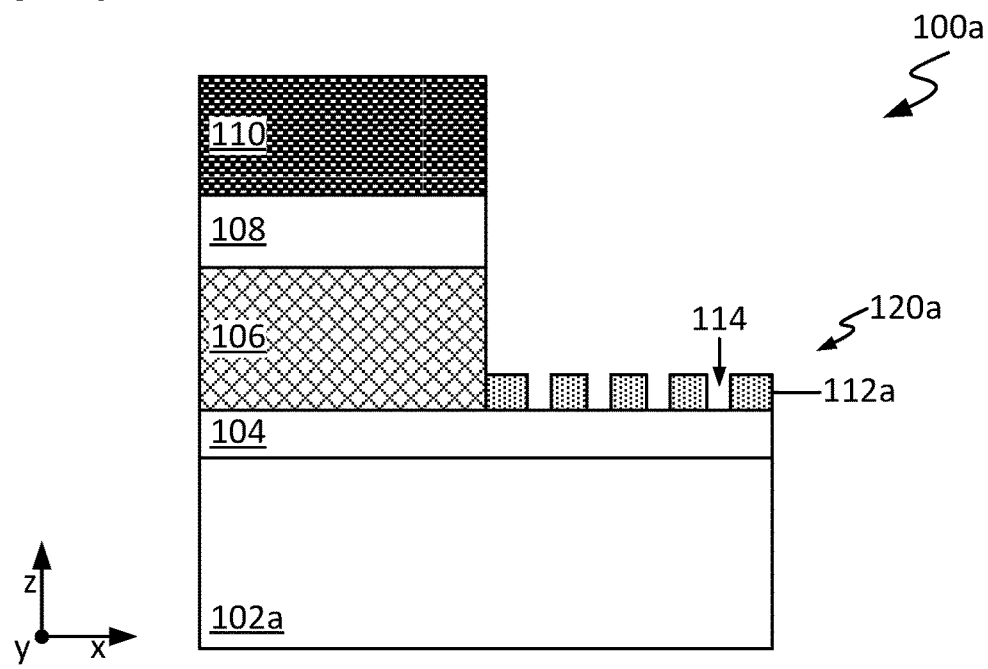

The process flow may continue as in FIG. 1C, which illustrates a cross-sectional view of the IC 100a of FIG. 1B after forming a source/drain (S/D) layer 112a patterned with feature(s) 114, in accordance with an embodiment of the present disclosure. S/D layer 112a may be disposed over semiconductor layer 104. In some cases, S/D layer 112a may be disposed directly on semiconductor layer 104 with no layers intervening, whereas in some other cases, one or more intervening layers may be disposed between S/D layer 112a and semiconductor layer 104. In a more general sense, S/D layer 112a may be disposed superjacent to semiconductor layer 104, optionally with one or more intervening layers, in accordance with some embodiments. In some instances, S/D layer 112a may be disposed laterally adjacent to insulator layer 106 (e.g., such as generally can be seen in FIG. 1C).

S/D layer 112a may be comprised of any of a wide range of suitable S/D material(s). For instance, in accordance with some embodiments, S/D layer 112a may be comprised of any one, or combination, of GaN, InGaN, and SiC, to name a few. In accordance with some embodiments, S/D layer 112a may be doped, at least in part, with a p-type dopant, such as boron (B) or magnesium (Mg), thereby providing p-type S/D portion(s) for CMOS transistor device 120a. In accordance with some embodiments, S/D layer 112a may be doped, at least in part, with an n-type dopant, such as Si, arsenic (As), or phosphorous (P), thereby providing n-type S/D portion(s) for CMOS transistor device 120a. The particular dopant type and concentration, as well as the doping profile (e.g., dopant gradient or other variation, if any) may be customized, as desired for a given target application or end-use.

S/D layer 112a may be formed via any suitable standard, custom, or proprietary technique(s), as will be apparent in light of this disclosure. In accordance with some embodiments, S/D layer 112a may be formed via any one, or combination, of a CVD process (e.g., an MOCVD process) and an epitaxial process (e.g., an MBE process).

The thickness (e.g., z-thickness in the z-direction) of S/D layer 112a may be customized, as desired for a given target application or end-use. In some cases, S/D layer 112a may have a z-thickness in the range of about 5-250 nm (e.g., about 5-125 nm, about 125-250 nm, or any other sub-range in the range of about 5-250 nm). Other suitable materials, doping schemes, formation techniques, and configurations, and dimensions for S/D layer 112a will depend on a given application and will be apparent in light of this disclosure.

A given feature 114 formed in S/D layer 112a may be, for example, a trench, through-hole, or other opening or recess that extends through the entire thickness of S/D layer 112a such that it exposes the surface of semiconductor layer 104. To that end, feature(s) 114 may be formed via any suitable standard, custom, or proprietary lithography, etch, and clean technique(s), as will be apparent in light of this disclosure. In accordance with some embodiments, a given feature 114 may be formed via any one, or combination, of a dry etch process and a wet etch process, the etch chemistry of which may be customized, as desired for a given target application or end-use. The dimensions and cross-sectional geometry of a given feature 114, as well as the pitch or other spacing of neighboring features 114, may be customized, as desired for a given target application or end-use. Other suitable formation techniques, configurations, and dimensions for feature(s) 114 of S/D layer 112a will depend on a given application and will be apparent in light of this disclosure.

Figure 1D:
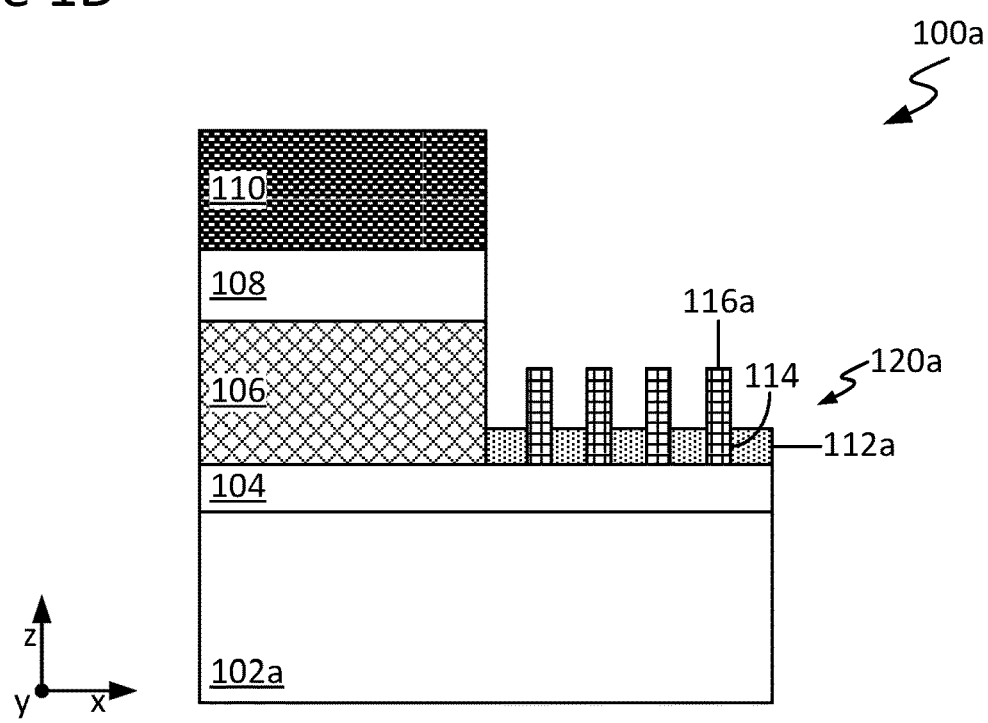

The process flow may continue as in FIG. 1D, which illustrates a cross-sectional view of the IC 100a of FIG. 1C after forming a gate stack layer 116a for CMOS transistor device 120a, in accordance with an embodiment of the present disclosure. Gate stack layer 116a may be disposed over semiconductor layer 104, at least partially within feature(s) 114 of S/D layer 112a. In some cases, gate stack layer 116a may be disposed directly on semiconductor layer 104 with no layers intervening, whereas in some other cases, one or more intervening layers may be disposed between gate stack layer 116a and semiconductor layer 104. In a more general sense, gate stack layer 116a may be disposed superjacent to semiconductor layer 104, optionally with one or more intervening layers, in accordance with some embodiments. In some instances, gate stack layer 116a may be disposed laterally adjacent to insulator layer 106 (e.g., such as generally can be seen in FIG. 1D).

In accordance with some embodiments, gate stack layer 116a may include one or more gate dielectric layers and one or more gates disposed there over. In an example case, gate stack layer 116a may be configured as a replacement metal gate (RMG) process layer including one or more dummy gate dielectric layers and one or more RMG process gates disposed there over. In accordance with some embodiments, a given gate dielectric layer (dummy or otherwise) of gate stack layer 116a may be comprised of any one, or combination, of suitable dielectric materials, such as aluminum oxide ($Al_2O_3$), hafnium oxide ($HfO_2$), silicon dioxide ($SiO_2$), silicon nitride ($Si_3N_4$), and zirconium dioxide ($ZrO_2$), to name a few. In accordance with some embodiments, a given gate (RMG process gate or otherwise) of gate stack layer 116a may be comprised of any one, or combination, of suitable metals or metal nitrides, such as tungsten (W), copper (Cu), aluminum (Al), titanium (Ti), titanium nitride (TiN), or an alloy of any thereof, to name a few.

Gate stack layer 116a may be formed via any suitable standard, custom, or proprietary technique(s), as will be apparent in light of this disclosure. In accordance with some embodiments, gate stack layer 116a may be formed via any one, or combination, of a physical vapor deposition (PVD) process (e.g., sputtering) and a CVD process.

The thickness (e.g., z-thickness in the z-direction) of gate stack layer 116a may be customized, as desired for a given target application or end-use. In some cases, gate stack layer 116a (or a given constituent dielectric or gate layer thereof) may have a z-thickness in the range of about 10-500 nm (e.g., about 10-250 nm, about 250-500 nm, or any other sub-range in the range of about 10-500 nm). In a more general sense, the z-thickness of a given gate dielectric layer or gate (or both) may be customized, as desired for a given target application or end-use. Other suitable materials, formation techniques, configurations, and dimensions for gate stack layer 116a will depend on a given application and will be apparent in light of this disclosure.

Figure 1E:
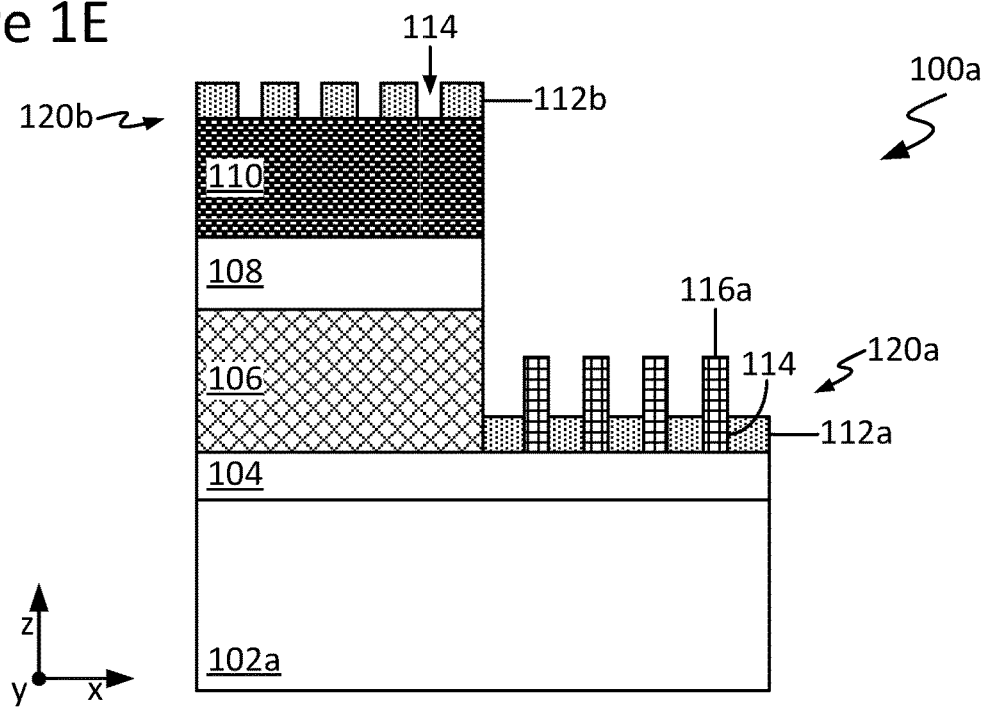

The process flow may continue as in FIG. 1E, which illustrates a cross-sectional view of the IC 100a of FIG. 1D after forming a S/D layer 112b patterned with feature(s) 114, in accordance with an embodiment of the present disclosure. S/D layer 112b may be disposed over III-N semiconductor layer 110. In some cases, S/D layer 112b may be disposed directly on III-N semiconductor layer 110 with no layers intervening, whereas in some other cases, one or more intervening layers may be disposed between S/D layer 112b and III-N semiconductor layer 110. In a more general sense, S/D layer 112b may be disposed superjacent to III-N semiconductor layer 110, optionally with one or more intervening layers, in accordance with some embodiments.

As will be appreciated in light of this disclosure, S/D layer 112b may be provided with any of the example materials, doping schemes, formation techniques, configurations, and dimensions discussed above, for instance, with respect to S/D layer 112a, in accordance with some embodiments. In some embodiments, S/D layer 112b may be doped with an n-type dopant, such as Si, As, or P, thereby providing n-type S/D portion(s) for NMOS transistor device 120b. The particular dopant type and concentration, as well as the doping profile (e.g., dopant gradient or other variation, if any) may be customized, as desired for a given target application or end-use.

As will be further appreciated, a given feature 114 of S/D layer 112b may be provided with any of the example formation techniques, configurations, and dimensions discussed above, for instance, with respect to feature(s) 114 of S/D layer 112a, in accordance with some embodiments. A given feature 114 formed in S/D layer 112b may be, for example, a trench, through-hole, or other opening or recess that extends through the entire thickness of S/D layer 112b such that it exposes the surface of III-N semiconductor layer 110.

Figure 1F:
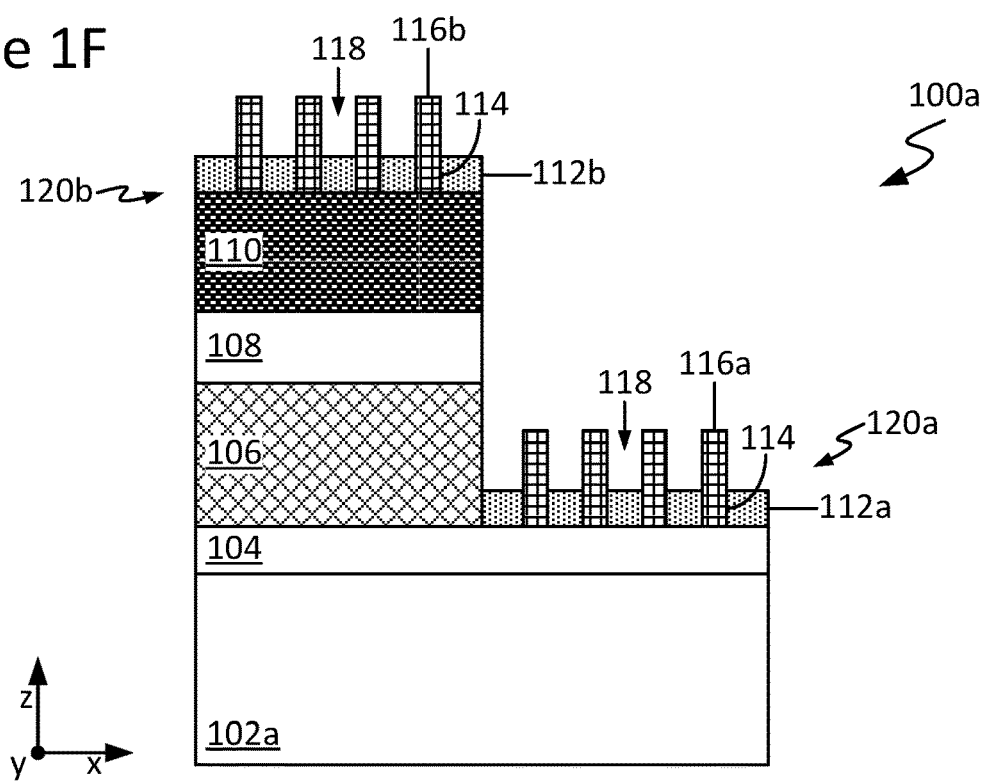

The process flow may continue as in FIG. 1F, which illustrates a cross-sectional view of the IC 100a of FIG. 1E after forming a gate stack layer 116b for NMOS transistor device 120b, in accordance with an embodiment of the present disclosure. Gate stack layer 116b may be disposed over III-N semiconductor layer 110, at least partially within feature(s) 114 of S/D layer 112b. In some cases, gate stack layer 116b may be disposed directly on III-N semiconductor layer 110 with no layers intervening, whereas in some other cases, one or more intervening layers may be disposed between gate stack layer 116b and III-N semiconductor layer 110. In a more general sense, gate stack layer 116b may be disposed superjacent to III-N semiconductor layer 110, optionally with one or more intervening layers, in accordance with some embodiments.

As with gate stack layer 116a discussed above, gate stack layer 116b may include one or more gate dielectric layers and one or more gates disposed there over, in accordance with some embodiments. In an example case, gate stack layer 116b may be configured as an RMG process layer including one or more dummy gate dielectric layers and one or more RMG process gates disposed there over. A given gate dielectric layer (dummy or otherwise) of gate stack layer 116b may be provided with any of the example materials discussed above, for instance, with respect to gate stack layer 116a, in accordance with some embodiments. In accordance with some embodiments, a given gate (RMG process gate or otherwise) of gate stack layer 116b may be comprised of any one, or combination, of suitable metals or metal nitrides, such as nickel (Ni), gold (Au), platinum (Pt), and titanium nitride (TiN), or an alloy of any thereof, to name a few. Gate stack layer 116b may be provided with any of the example formation techniques and dimensions discussed above, for instance, with respect to gate stack layer 116a, in accordance with some embodiments.

FIGS. 2A-2F illustrate a process flow for forming an IC 100b in accordance with an embodiment of the present disclosure. As can be seen from FIG. 2F in particular and as discussed below, this process flow may be used, for example, to fabricate an IC 100b including a CMOS transistor device 120a (e.g., Si PMOS, NMOS, or both) and an NMOS transistor device 120b (e.g., III-N semiconductor NMOS) over a commonly shared semiconductor substrate, in accordance with some embodiments. As will be appreciated in light of this disclosure, in some cases, the process flow of FIGS. 2A-2F may result in a CMOS transistor device 120a and an NMOS transistor device 120b being generally co-planar (e.g., without a step height difference), as generally can be seen from FIG. 1F.

Figure 2A:
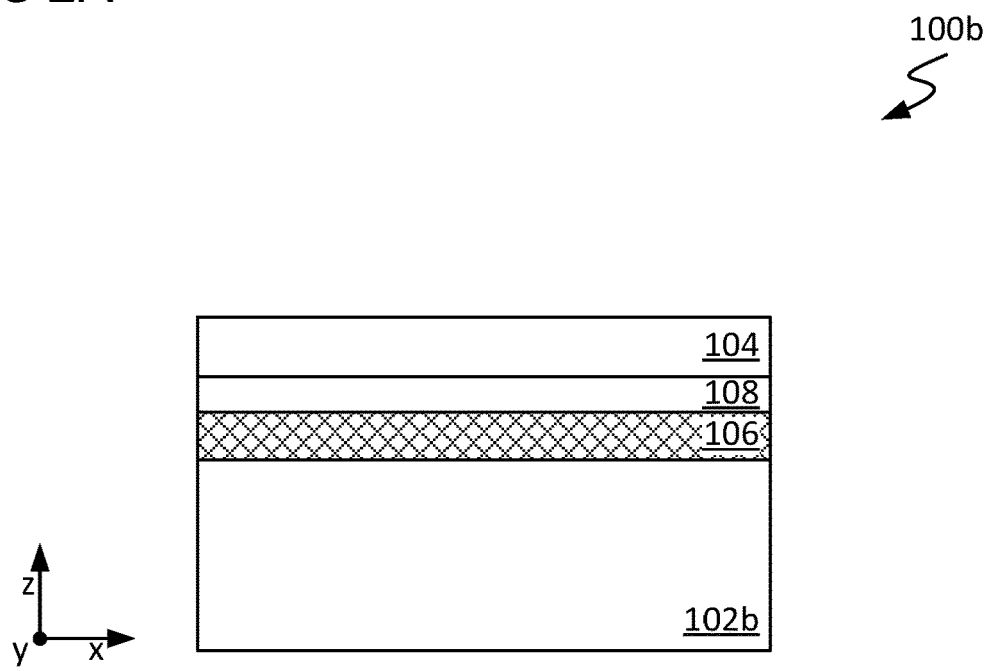
FIGS. 2A-2F illustrate a process flow for forming an IC in accordance with another embodiment of the present disclosure.

The process flow may begin as in FIG. 2A, which illustrates a cross-sectional view of an IC 100b configured in accordance with an embodiment of the present disclosure. As can be seen, IC 100b may include a semiconductor substrate 102b, which may be provided with any of the example materials and configurations discussed above, for instance, with respect to semiconductor substrate 102a, in accordance with some embodiments. In some embodiments, semiconductor substrate 102b may be comprised of Si having a crystallographic orientation of (111).

Also, as can be seen, IC 100b may include an insulator layer 106 disposed over semiconductor substrate 102b. In some cases, insulator layer 106 may be disposed directly on semiconductor substrate 102b with no layers intervening, whereas in some other cases, one or more intervening layers may be disposed between insulator layer 106 and semiconductor substrate 102b. In a more general sense, insulator layer 106 may be disposed superjacent to semiconductor substrate 102b, optionally with one or more intervening layers, in accordance with some embodiments. As will be appreciated in light of this disclosure, insulator layer 106 may be formed with any of the example materials, formation techniques, and dimensions discussed above, for instance, with respect to insulator layer 106 of IC 100a, in accordance with some embodiments. As will be further appreciated, it may be desirable, at least in some instances, to provide an insulator layer 106 of sufficient thickness to ensure that it is sufficiently electrically non-leaky for IC 100b.

As can be seen further from FIG. 2A, IC 100b may include a semiconductor layer 108 disposed over insulator layer 106, and a semiconductor layer 104 disposed over semiconductor layer 108. In some cases, semiconductor layer 108 may be disposed directly on insulator layer 106 with no layers intervening, whereas in some other cases, one or more intervening layers may be disposed between semiconductor layer 108 and insulator layer 106. In some cases, semiconductor layer 104 may be disposed directly on semiconductor layer 108 with no layers intervening, whereas in some other cases, one or more intervening layers may be disposed between semiconductor layer 104 and semiconductor layer 108. In a more general sense, semiconductor layer 108 may be disposed superjacent to insulator layer 106 and semiconductor layer 104 may be disposed superjacent to semiconductor layer 108, each optionally with one or more intervening layers, in accordance with some embodiments.

As will be appreciated in light of this disclosure, semiconductor layer 108 may be provided with any of the example materials, configurations, and dimensions discussed above, for instance, with respect to semiconductor layer 108 of IC 100a, in accordance with some embodiments. In some cases, semiconductor layer 108 and semiconductor substrate 102b may be comprised of the same semiconductor materials (e.g., both semiconductor layer 108 and semiconductor substrate 102b may be comprised of Si), whereas in some other cases, semiconductor layer 108 and semiconductor substrate 102b may differ in material composition. In some embodiments, semiconductor layer 108 may have a crystallographic orientation of (100), though in other embodiments, other crystallographic orientations may be provided. In some instances, semiconductor layer 108 and semiconductor substrate 102b may be of different crystallographic orientation, for example, semiconductor layer 108 may have a crystallographic orientation of (100), and semiconductor substrate 102b may have a crystallographic orientation of (111).

As will be further appreciated, semiconductor layer 104 may be provided with any of the example materials, doping schemes, configurations, and dimensions discussed above, for instance, with respect to semiconductor layer 104 of IC 100a, in accordance with some embodiments. In accordance with some embodiments, semiconductor layer 104 may serve to decouple doping of one or more overlying device layers from underlying semiconductor substrate 102b. In some cases, semiconductor layer 104 and semiconductor substrate 102b may be comprised of the same semiconductor materials (e.g., both semiconductor layer 104 and semiconductor substrate 102b may be comprised of Si), whereas in some other cases, semiconductor layer 104 and semiconductor substrate 102b may differ in material composition. In some embodiments, semiconductor layer 104 may have a crystallographic orientation of (100), though in other embodiments, other crystallographic orientations may be provided. In some instances, semiconductor layer 104 may be of the same crystallographic orientation as semiconductor substrate 102b, whereas in other instances, semiconductor layer 104 and semiconductor substrate 102b may be of different crystallographic orientations.

Semiconductor layer 108 and semiconductor layer 104 may be formed via any suitable standard, custom, or proprietary technique(s), as will be apparent in light of this disclosure. In accordance with some embodiments, semiconductor layer 108 and semiconductor layer 104 may be transferred to IC 100b from a carrier substrate (e.g., carrier wafer). More particularly, in accordance with an embodiment, semiconductor layer 104 may be formed initially over a carrier substrate, and semiconductor layer 108 may be formed initially over that semiconductor layer 104, and then the resultant stack may be bonded with insulator layer 106 via any suitable standard, custom, or proprietary bonding technique(s), as will be apparent in light of this disclosure. Thereafter, in accordance with an embodiment, the carrier substrate may be separated from semiconductor layer 104, leaving behind semiconductor layer 104 and semiconductor layer 108 as a portion of IC 100b. To that end, semiconductor layer 104 may be separated from the carrier substrate via any of the example techniques discussed above, for instance, with respect to transferring semiconductor layer 108 to IC 100a, in accordance with some embodiments. In accordance with an embodiment, before further processing, semiconductor layer 104 optionally may undergo planarization via a CMP process or other suitable planarization process, as will be apparent in light of this disclosure.

Figure 2B:
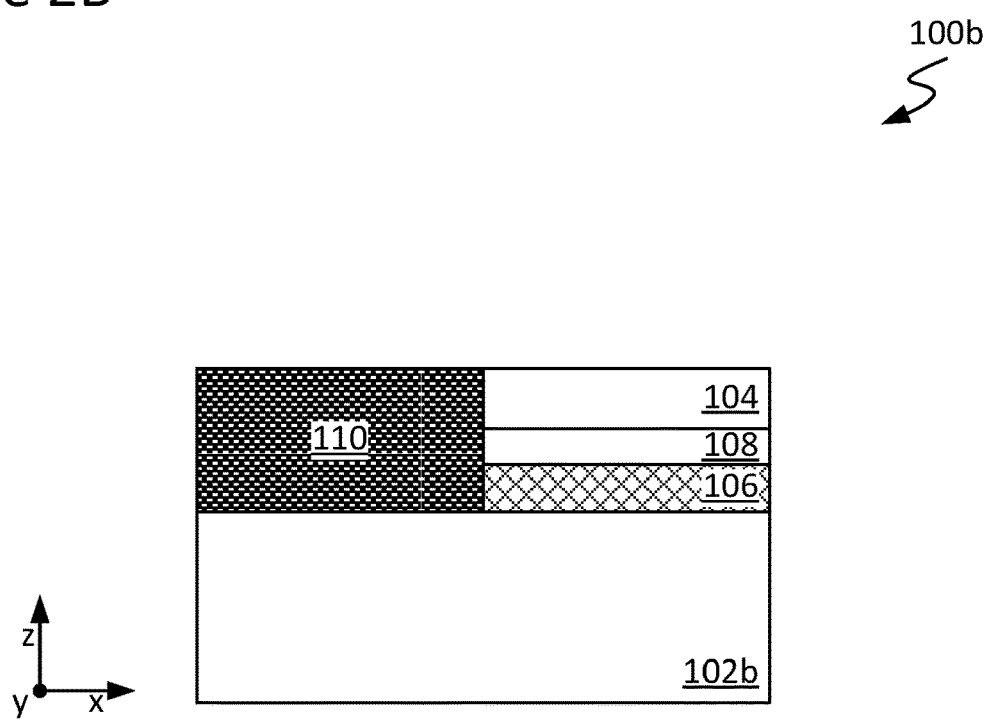

The process flow may continue as in FIG. 2B, which illustrates a cross-sectional view of IC 100b after forming a III-N semiconductor layer 110, in accordance with an embodiment of the present disclosure. III-N semiconductor layer 110 may be disposed over semiconductor substrate 102b. In some cases, III-N semiconductor layer 110 may be disposed directly on semiconductor substrate 102b with no layers intervening, whereas in some other cases, one or more intervening layers may be disposed between III-N semiconductor layer 110 and semiconductor substrate 102b. In a more general sense, III-N semiconductor layer 110 may be disposed superjacent to semiconductor substrate 102b, optionally with one or more intervening layers, in accordance with some embodiments. In some instances, III-N semiconductor layer 110 may be disposed laterally adjacent to any one, or combination, of insulator layer 106, semiconductor layer 108, and semiconductor layer 104 (e.g., such as generally can be seen in FIG. 2B).

As will be appreciated in light of this disclosure, III-N semiconductor layer 110 may be provided with any of the example materials, formation techniques, configurations, and dimensions discussed above, for instance, with respect to III-N semiconductor layer 110 of IC 100a, in accordance with some embodiments. In some cases, a nucleation layer optionally may be formed over semiconductor substrate 102b, and III-N semiconductor layer 110 may be formed over that nucleation layer. As will be further appreciated, such an optional nucleation layer may be provided with any of the example materials, formation techniques, configurations, and dimensions discussed above, for instance, with respect to a nucleation layer optionally provided between semiconductor layer 108 and III-N semiconductor layer 110 of IC 100a, in accordance with some embodiments.

In accordance with some embodiments, semiconductor layer 104, semiconductor layer 108, and insulator layer 106 may be partially removed from IC 100b before forming III-N semiconductor layer 110 over semiconductor substrate 102b. The resultant IC 100b may include a stack of layers disposed over semiconductor substrate 102b, including insulator layer 106, semiconductor layer 108, and semiconductor layer 104, as generally can be seen from FIG. 2B. In accordance with some embodiments, partial removal of semiconductor layer 104, semiconductor layer 108, and insulator layer 106 materials may be provided via any suitable standard, custom, or proprietary lithography, etch, and clean process(es), as will be apparent in light of this disclosure. In partially removing semiconductor layer 104, semiconductor layer 108, and insulator layer 106, the surface of underlying semiconductor substrate 102b may be exposed for further processing, as described herein.

Figure 2C:
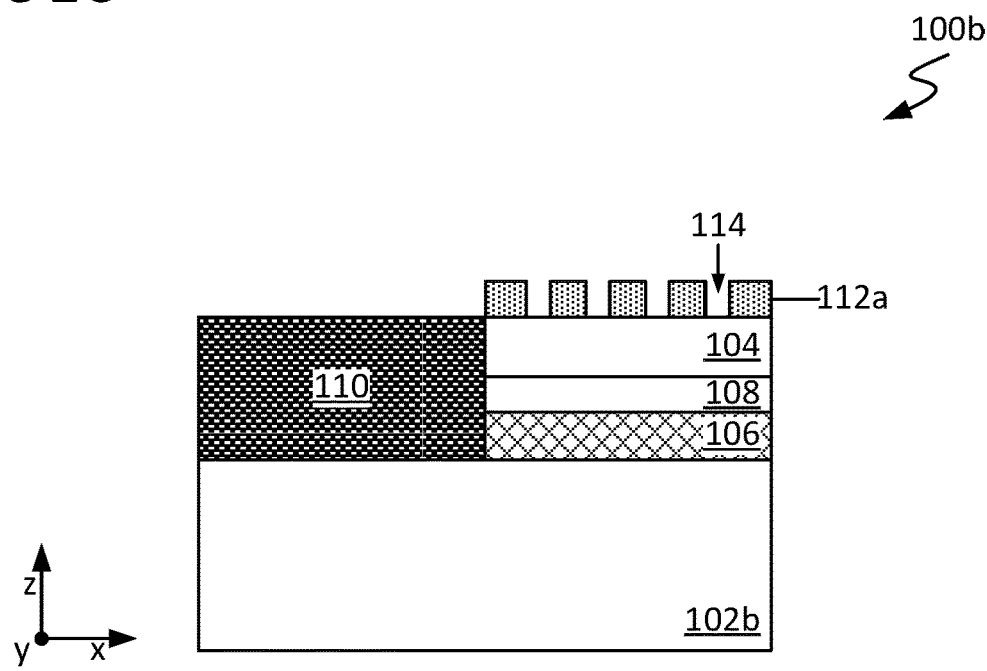

The process flow may continue as in FIG. 2C, which illustrates a cross-sectional view of IC 100b after forming a S/D layer 112a patterned with feature(s) 114, in accordance with an embodiment of the present disclosure. S/D layer 112a may be disposed over semiconductor layer 104. In some cases, S/D layer 112a may be disposed directly on semiconductor layer 104 with no layers intervening, whereas in some other cases, one or more intervening layers may be disposed between S/D layer 112a and semiconductor layer 104. In a more general sense, S/D layer 112a may be disposed superjacent to semiconductor layer 104, optionally with one or more intervening layers, in accordance with some embodiments.

As will be appreciated in light of this disclosure, S/D layer 112a may be provided with any of the example materials, doping schemes, formation techniques, configurations, and dimensions discussed above, for instance, with respect to S/D layer 112a of IC 100a, in accordance with some embodiments. As will be further appreciated, a given feature 114 of S/D layer 112a may be provided with any of the example formation techniques, configurations, and dimensions discussed above, for instance, with respect to feature (s) 114 of S/D layer 112a of IC 100a, in accordance with some embodiments. A given feature 114 formed in S/D layer 112a may be, for example, a trench, through-hole, or other opening or recess that extends through the entire thickness of S/D layer 112a such that it exposes the surface of semiconductor layer 104.

Figure 2D:
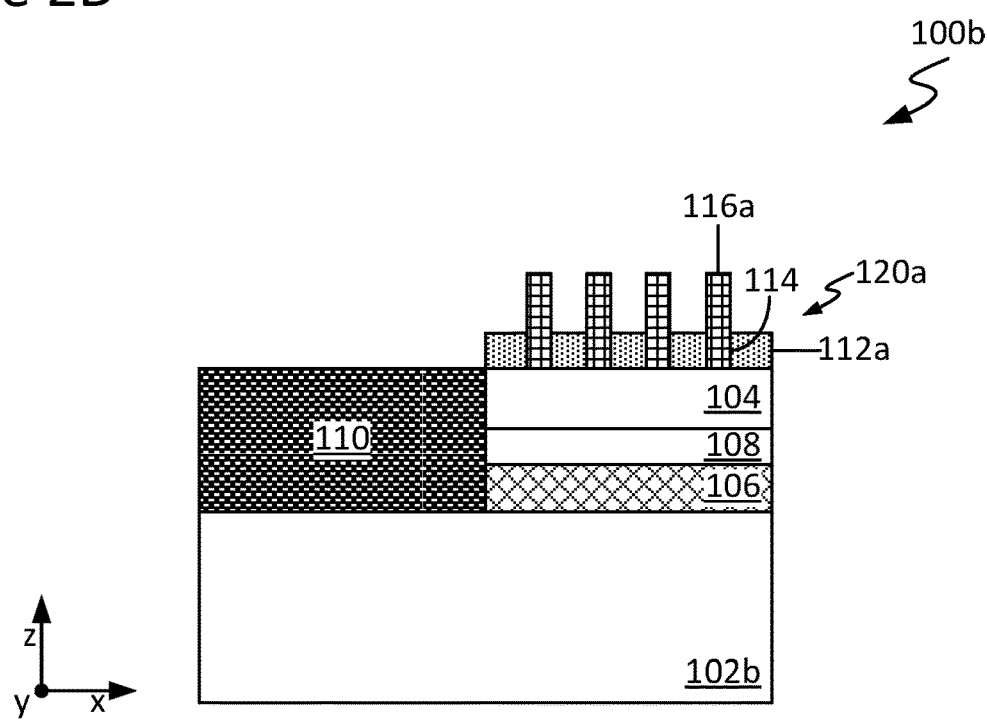

The process flow may continue as in FIG. 2D, which illustrates a cross-sectional view of IC 100b after forming a gate stack layer 116a for CMOS transistor device 120a, in accordance with an embodiment of the present disclosure. Gate stack layer 116a may be disposed over semiconductor layer 104, at least partially within feature(s) 114 of S/D layer 112a. In some cases, gate stack layer 116a may be disposed directly on semiconductor layer 104 with no layers intervening, whereas in some other cases, one or more intervening layers may be disposed between gate stack layer 116a and semiconductor layer 104. In a more general sense, gate stack layer 116a may be disposed superjacent to semiconductor layer 104, optionally with one or more intervening layers, in accordance with some embodiments. As will be appreciated in light of this disclosure, gate stack layer 116a may be provided with any of the example materials, formation techniques, configurations, and dimensions discussed above, for instance, with respect to gate stack layer 116a of IC 100a, in accordance with some embodiments.

Figure 2E:
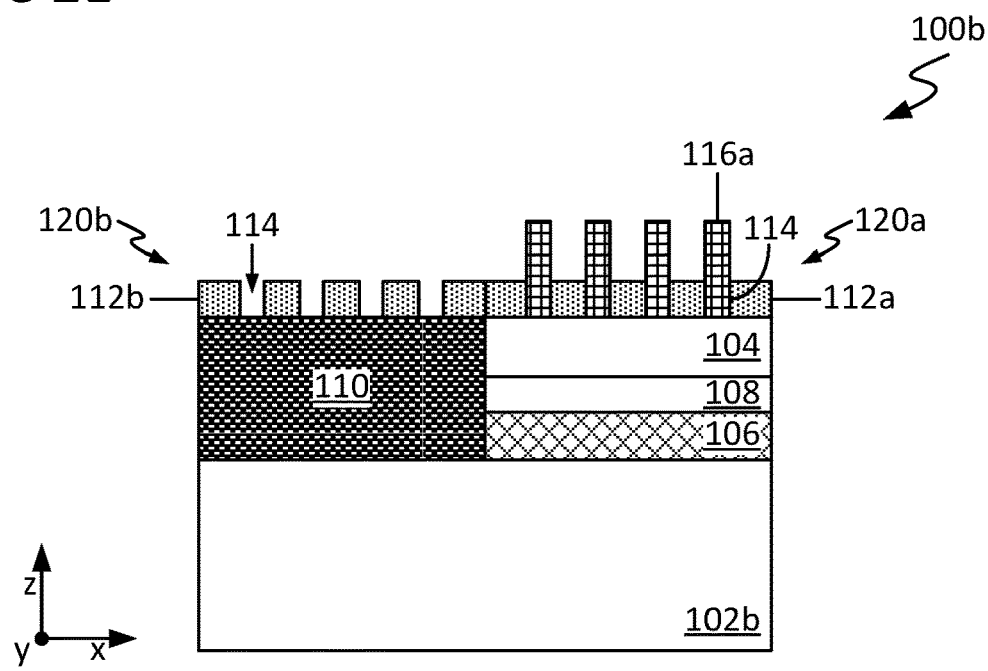

The process flow may continue as in FIG. 2E, which illustrates a cross-sectional view of IC 100b after forming a S/D layer 112b patterned with feature(s) 114, in accordance with an embodiment of the present disclosure. S/D layer 112b may be disposed over III-N semiconductor layer 110. In some cases, S/D layer 112b may be disposed directly on III-N semiconductor layer 110 with no layers intervening, whereas in some other cases, one or more intervening layers may be disposed between S/D layer 112b and III-N semiconductor layer 110. In a more general sense, S/D layer 112b may be disposed superjacent to III-N semiconductor layer 110, optionally with one or more intervening layers, in accordance with some embodiments. As will be appreciated in light of this disclosure, S/D layer 112b may be provided with any of the example materials, doping schemes, formation techniques, configurations, and dimensions discussed above, for instance, with respect to S/D layer 112b of IC 100a, in accordance with some embodiments. As will be further appreciated, a given feature 114 of S/D layer 112b may be provided with any of the example formation techniques, configurations, and dimensions discussed above, for instance, with respect to feature(s) 114 of S/D layer 112a, in accordance with some embodiments. A given feature 114 formed in S/D layer 112b may be, for example, a trench, through-hole, or other opening or recess that extends through the entire thickness of S/D layer 112b such that it exposes the surface of III-N semiconductor layer 110.

Figure 2F:
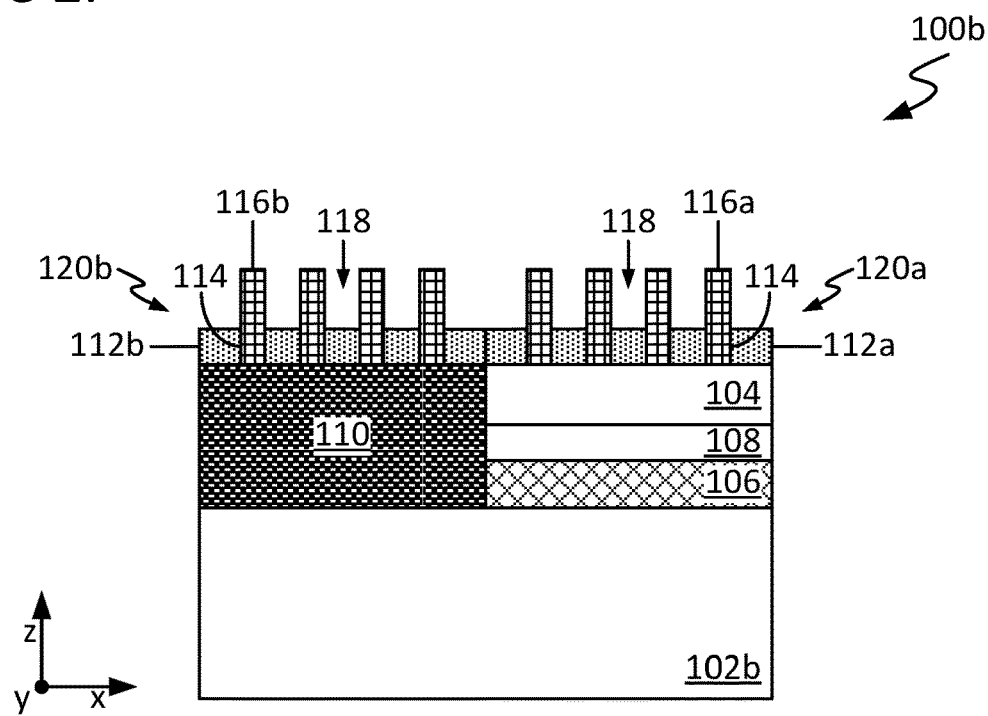

The process flow may continue as in FIG. 2F, which illustrates a cross-sectional view of IC 100b after forming a gate stack layer 116b for NMOS transistor device 120b, in accordance with an embodiment of the present disclosure. Gate stack layer 116b may be disposed over III-N semiconductor layer 110, at least partially within feature(s) 114 of S/D layer 112b. In some cases, gate stack layer 116b may be disposed directly on III-N semiconductor layer 110 with no layers intervening, whereas in some other cases, one or more intervening layers may be disposed between gate stack layer 116b and III-N semiconductor layer 110. In a more general sense, gate stack layer 116b may be disposed superjacent to III-N semiconductor layer 110, optionally with one or more intervening layers, in accordance with some embodiments. As will be appreciated in light of this disclosure, gate stack layer 116b may be provided with any of the example materials, formation techniques, configurations, and dimensions discussed above, for instance, with respect to gate stack layer 116b of IC 100a, in accordance with some embodiments.

In accordance with some embodiments, each of the process flows of FIGS. 1A-1F and FIGS. 2A-2F optionally may continue with forming S/D contacts for CMOS device 120a and/or NMOS device 120b in region(s) 118 over the S/D portions of S/D layers 112a and/or 112b. A given S/D contact may be comprised of any suitable electrically conductive material(s), as will be apparent in light of this disclosure. For instance, in some cases, a given S/D contact may be formed from any one, or combination, of nickel (Ni), gold (Au), platinum (Pt), titanium (Ti), aluminum (Al), tungsten (W), or an alloy of any thereof, to name a few. A given S/D contact may be formed via any suitable standard, custom, or proprietary technique(s), as will be apparent in light of this disclosure. Moreover, the dimensions of a given S/D contact may be customized, as desired for a given target application or end-use. Other suitable materials, formation techniques, and dimensions for S/D contact(s) provided in region(s) 118 will depend on a given application and will be apparent in light of this disclosure.

As discussed herein, the various constituent layers of ICs 100a and 100b may have any of a wide range of thicknesses (e.g., z-thicknesses in the z-direction or other designated thickness), as desired for a given target application or end-use. In some instances, a given layer may be provided as a monolayer over an underlying topography. For a given IC 100a or 100b, in some cases, a given constituent layer thereof may have a substantially uniform thickness over an underlying topography. In some instances, a given constituent layer may be provided as a substantially conformal layer over an underlying topography. In other instances, a given constituent layer may be provided with a non-uniform or otherwise varying thickness over an underlying topography. For example, in some cases, a first portion of a given layer may have a thickness within a first range, whereas a second portion thereof may have a thickness within a second, different range. In some instances, a given layer may have first and second portions having average thicknesses that are different from one another by about 20% or less, about 15% or less, about 10% or less, or about 5% or less. Numerous configurations and variations will be apparent in light of this disclosure.

Example System

Figure 3:
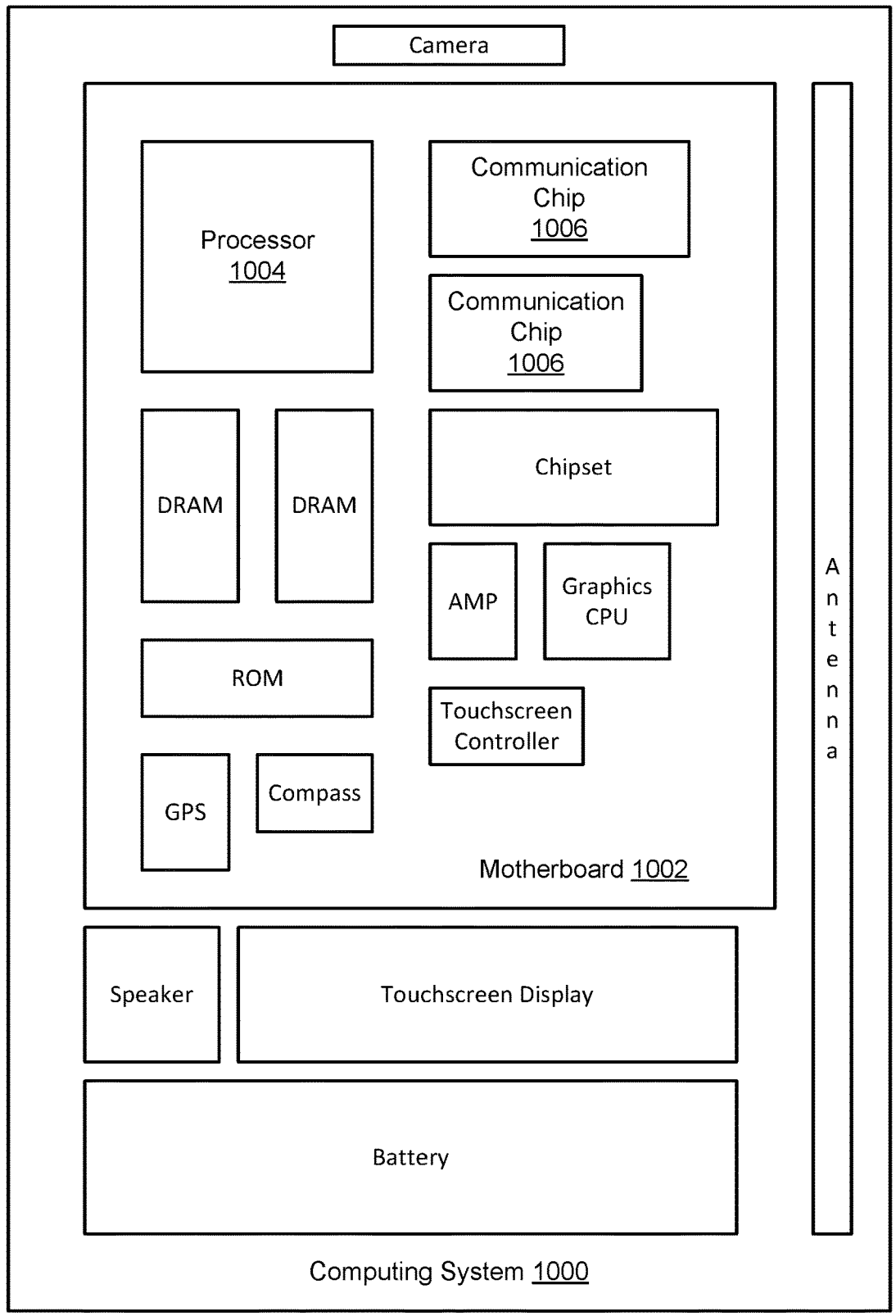
FIG. 3 illustrates a computing system implemented with integrated circuit structures or devices formed using the disclosed techniques in accordance with an example embodiment.

FIG. 3 illustrates a computing system 1000 implemented with integrated circuit structures or devices formed using the disclosed techniques in accordance with an example embodiment. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

FURTHER EXAMPLE EMBODIMENTS

The following examples pertain to further embodiments, from which numerous permutations and configurations will be apparent.

Example 1 is an integrated circuit including: a semiconductor substrate having a first crystallographic orientation; a first semiconductor layer disposed over the semiconductor substrate and having a second crystallographic orientation, wherein the second crystallographic orientation is different from the first crystallographic orientation of the semiconductor substrate; a second semiconductor layer disposed over the semiconductor substrate and having a third crystallographic orientation; and a III-N semiconductor layer disposed over the semiconductor substrate.

Example 2 includes the subject matter of any of Examples 1, 3-5, and 9-10, wherein: the semiconductor substrate includes silicon, and the first crystallographic orientation is (100); and the first semiconductor layer includes silicon, and the second crystallographic orientation is (111).

Example 3 includes the subject matter of any of Examples 1-2, 4-5, and 9-10, wherein the III-N semiconductor layer is disposed over the first semiconductor layer.

Example 4 includes the subject matter of any of Examples 1-3, 5, and 9-10 and further includes an insulator layer disposed between the second semiconductor layer and the first semiconductor layer.

Example 5 includes the subject matter of any of Examples 1-4 and 9-10, wherein the second semiconductor layer includes p⁻ epitaxial silicon, and the third crystallographic orientation is the same as the first crystallographic orientation of the semiconductor substrate.

Example 6 includes the subject matter of any of Examples 1 and 7-10, wherein: the semiconductor substrate includes silicon, and the first crystallographic orientation is (111); and the first semiconductor layer includes silicon, and the second crystallographic orientation is (100).

Example 7 includes the subject matter of any of Examples 1, 6, and 8-10 and further includes an insulator layer disposed between the semiconductor substrate and the first semiconductor layer.

Example 8 includes the subject matter of any of Examples 1, 6-7, and 9-10, wherein the second semiconductor layer includes p⁻ epitaxial silicon, and the third crystallographic orientation is different from the first crystallographic orientation of the semiconductor substrate.

Example 9 includes the subject matter of any of Examples 1-8 and 10 and further includes at least one of: a first source/drain (S/D) layer disposed over the second semiconductor layer; and a second S/D layer disposed over the III-N semiconductor layer.

Example 10 includes the subject matter of Example 9 and further includes at least one of: a first gate stack at least partially disposed within the first S/D layer, over the second semiconductor layer; and a second gate stack at least partially disposed within the second S/D layer, over the III-N semiconductor layer.

Example 11 is a method of forming an integrated circuit, the method including: forming a first semiconductor layer over a semiconductor substrate, wherein: the semiconductor substrate has a first crystallographic orientation; and the first semiconductor layer has a second crystallographic orientation that is different from the first crystallographic orientation; forming a second semiconductor layer over the semiconductor substrate, the second semiconductor layer having a third crystallographic orientation; and forming a III-N semiconductor layer over the semi conductor substrate.

Example 12 includes the subject matter of any of Examples 11, 13-15, and 19-20, wherein: the semiconductor substrate includes silicon, and the first crystallographic orientation is (100); and the first semiconductor layer includes silicon, and the second crystallographic orientation is (111).

Example 13 includes the subject matter of any of Examples 11-12, 14-15, and 19-20, wherein forming the III-N semiconductor layer over the semiconductor substrate includes: forming the III-N semiconductor layer over the first semiconductor layer.

Example 14 includes the subject matter of any of Examples 11-13, 15, and 19-20 and further includes: forming an insulator layer over the second semiconductor layer, wherein the first semiconductor layer is disposed over the insulator layer.

Example 15 includes the subject matter of any of Examples 11-14 and 19-20, wherein the second semiconductor layer includes p⁻ epitaxial silicon, and the third crystallographic orientation is the same as the first crystallographic orientation of the semiconductor substrate.

Example 16 includes the subject matter of any of Examples 11 and 17-20, wherein: the semiconductor substrate includes silicon, and the first crystallographic orientation is (111); and the first semiconductor layer includes silicon, and the second crystallographic orientation is (100).

Example 17 includes the subject matter of any of Examples 11, 16, and 18-20 and further includes: forming an insulator layer over the semiconductor substrate, wherein the first semiconductor layer is disposed over the insulator layer.

Example 18 includes the subject matter of any of Examples 11, 16-17, and 19-20, wherein the second semiconductor layer includes p⁻ epitaxial silicon, and the third crystallographic orientation is different from the first crystallographic orientation of the semi conductor substrate.

Example 19 includes the subject matter of any of Examples 11-18 and 20 and further includes at least one of: forming a first source/drain (S/D) layer over the second semiconductor layer; and forming a second S/D layer over the III-N semiconductor layer.

Example 20 includes the subject matter of Example 19 and further includes at least one of: forming a first gate stack at least partially within the first S/D layer, over the second semiconductor layer; and forming a second gate stack at least partially within the second S/D layer, over the III-N semiconductor layer.

Example 21 is an integrated circuit including: a silicon substrate having a crystallographic orientation of (100); a first silicon layer disposed over the silicon substrate; an oxide layer disposed over a first portion of the first silicon layer; a second silicon layer disposed over the oxide layer and having a different crystallographic orientation from the silicon substrate; and a III-N semiconductor layer disposed over the second silicon layer.

Example 22 includes the subject matter of any of Examples 21 and 23-26, wherein the second silicon layer has a crystallographic orientation of (111).

Example 23 includes the subject matter of any of Examples 21-22 and 24-26, wherein the first silicon layer has the same crystallographic orientation as the silicon substrate.

Example 24 includes the subject matter of any of Examples 21-23 and 25-26 and further includes: a first source/drain (S/D) layer disposed over a second portion of the second semiconductor layer; a first gate stack disposed at least partially within the first S/D layer, over the second portion of the second semiconductor layer; a second S/D layer disposed over the III-N semiconductor layer; and a second gate stack disposed at least partially within the second S/D layer, over the III-N semiconductor layer.

Example 25 includes the subject matter of any of Examples 24 and 26, wherein the first S/D layer is disposed at a different step height from the second S/D layer.

Example 26 includes the subject matter of any of Examples 24-25, wherein at least one of the first S/D layer and the first gate stack is disposed laterally adjacent to the oxide layer.

Example 27 is an integrated circuit including: a silicon substrate having a crystallographic orientation of (111); an oxide layer disposed over a first portion of the silicon substrate; a first silicon layer disposed over the oxide layer and having a different crystallographic orientation from the silicon substrate; a second silicon layer disposed over the first silicon layer; and a III-N semiconductor layer disposed over a second portion of the silicon substrate.

Example 28 includes the subject matter of any of Examples 27 and 29-32, wherein the first silicon layer has a crystallographic orientation of (100).

Example 29 includes the subject matter of any of Examples 27-28 and 30-32, wherein the second silicon layer has a different crystallographic orientation from the silicon substrate.

Example 30 includes the subject matter of any of Examples 27-29 and 31-32 and further includes: a first source/drain (S/D) layer disposed over the second semiconductor layer; a first gate stack disposed at least partially within the first S/D layer, over the second semiconductor layer; a second S/D layer disposed over the III-N semiconductor layer; and a second gate stack disposed at least partially within the second S/D layer, over the III-N semiconductor layer.

Example 31 includes the subject matter of any of Examples 30 and 32, wherein the first S/D layer and the second S/D layer are co-planar.

Example 32 includes the subject matter of any of Examples 30-31, wherein the III-N semiconductor layer is disposed laterally adjacent to the oxide layer.

Example 33 is an integrated circuit including: a semiconductor substrate; a silicon p-type metal-oxide-semiconductor (PMOS) transistor device disposed over a first portion of the semiconductor substrate; and a III-N semiconductor n-type metal-oxide-semiconductor (NMOS) transistor device disposed over a second portion of the semiconductor substrate.

Example 34 includes the subject matter of any of Examples 33 and 35-37, wherein: the semiconductor substrate includes silicon having a crystallographic orientation of (100); the integrated circuit further includes a silicon layer disposed over the semiconductor substrate, the silicon layer having a crystallographic orientation of (111); and the III-N semiconductor NMOS transistor device is disposed over the silicon layer.

Example 35 includes the subject matter of any of Examples 33-34 and 36-37, wherein: the semiconductor substrate includes silicon having a crystallographic orientation of (111); the integrated circuit further includes a silicon layer disposed over the semiconductor substrate, the silicon layer having a crystallographic orientation of (100); and the silicon PMOS transistor device is disposed over the silicon layer.

Example 36 includes the subject matter of any of Examples 33-35 and 37, wherein the silicon PMOS transistor device and the III-N semiconductor NMOS transistor device have a step height difference.

Example 37 includes the subject matter of any of Examples 33-36, wherein the silicon PMOS transistor device and the III-N semiconductor NMOS transistor device are co-planar.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future-filed applications claiming priority to this application may claim the disclosed subject matter in a different manner and generally may include any set of one or more limitations as variously disclosed or otherwise demonstrated herein.

What is claimed is:

1. An integrated circuit comprising:
a semiconductor substrate having a first crystallographic orientation;
a first semiconductor layer over the semiconductor substrate and having a second crystallographic orientation;
a second semiconductor layer over the first semiconductor layer and having a third crystallographic orientation, wherein the third crystallographic orientation is different from the first crystallographic orientation of the semiconductor substrate;
a III-N semiconductor layer over the second semiconductor layer;
one or more first transistor devices on the first semiconductor layer; and one or more second transistor devices on the III-N semiconductor layer.

2. The integrated circuit of claim 1, wherein the one or more first transistor devices includes a first source/drain (S/D) layer, and the one or more second transistor devices includes a second S/D layer.

3. The integrated circuit of claim 2, wherein the one or more first transistor devices includes a first gate stack at least partially within the first S/D layer, and the one or more second transistor devices includes a second gate stack at least partially within the second S/D layer.

4. The integrated circuit of claim 1, wherein:
the semiconductor substrate comprises silicon, and the first crystallographic orientation is (100); and
the second semiconductor layer comprises silicon, and the third crystallographic orientation is (111).

5. The integrated circuit of claim 1, further comprising an insulator layer between the second semiconductor layer and the first semiconductor layer.

6. The integrated circuit of claim 1, wherein the first semiconductor layer comprises p-doped epitaxial silicon, and the second crystallographic orientation is the same as the first crystallographic orientation of the semiconductor substrate.

7. The integrated circuit of claim 1, wherein:
the semiconductor substrate comprises silicon, and the first crystallographic orientation is (111); and
the second semiconductor layer comprises silicon, and the third crystallographic orientation is (100).

8. The integrated circuit of claim 1, further comprising an insulator layer between the semiconductor substrate and the second semiconductor layer.

9. The integrated circuit of claim 1, wherein the first semiconductor layer comprises p-doped epitaxial silicon, and the second crystallographic orientation is different from the first crystallographic orientation of the semiconductor substrate.

10. The integrated circuit of claim 1, wherein the one or more first transistor devices are at a different height above the substrate than the one or more second transistor devices.

11. A method of forming an integrated circuit, the method comprising:
forming a first semiconductor layer over a semiconductor substrate, wherein:
the semiconductor substrate has a first crystallographic orientation; and
the first semiconductor layer has a second crystallographic orientation;
forming a second semiconductor layer over the first semiconductor layer, the second semiconductor layer having a third crystallographic orientation that is different from the first crystallographic orientation;
forming a III-N semiconductor layer over the second semiconductor layer;
forming one or more first transistor devices on the second first semiconductor layer; and
forming one or more second transistor devices on the III-N semiconductor layer.

12. The method of claim 11 further comprising:
forming an insulator layer over the first semiconductor layer, wherein the second semiconductor layer is disposed over the insulator layer.

13. The method of claim 11
wherein forming one or more first transistor devices comprises forming a first source/drain (S/D) layer and a first gate stack at least partially within the first S/D layer, and wherein forming one or more second transistor devices comprises forming a second S/D layer and a second gate stack at least partially within the second S/D layer.

14. The method of claim 11, wherein the one or more first transistor devices are formed at a different height above the substrate than the one or more second transistor devices.

15. An integrated circuit comprising:
   a silicon substrate having a crystallographic orientation of (100);
   a first silicon layer over the silicon substrate;
   an oxide layer over a first portion of the first silicon layer;
   a second silicon layer over the oxide layer and having a different crystallographic orientation from the silicon substrate;
   a III-N semiconductor layer over the second silicon layer;
   one or more first transistor devices on the first silicon layer; and
   one or more second transistor devices on the III-N semiconductor layer.

16. The integrated circuit of claim 15, wherein the second silicon layer has a crystallographic orientation of (111).

17. The integrated circuit of claim 15, wherein the one or more first transistor devices includes a first source/drain (S/D) layer and a first gate stack at least partially within the first S/D layer, and wherein the one or more second transistor devices includes a second S/D layer and a second gate stack at least partially within the second S/D layer, wherein at least one of:

the first S/D layer is at a different step height from the second S/D layer; and
one or both of the first S/D layer and the first gate stack is laterally adjacent to the oxide layer.

18. An integrated circuit comprising:
   a silicon substrate having a crystallographic orientation of (111);
   an oxide layer over a first portion of the silicon substrate;
   a first silicon layer over the oxide layer and having a different crystallographic orientation from the silicon substrate;
   a second silicon layer over the first silicon layer;
   a III-N semiconductor layer over a second portion of the silicon substrate and laterally adjacent to the oxide layer;
   one or more first transistor devices on the second silicon layer; and
   one or more second transistor devices on the III-N semiconductor layer.

19. The integrated circuit of claim 18, wherein the first silicon layer has a crystallographic orientation of (100).

20. The integrated circuit of claim 18, wherein the one or more first transistor devices includes a first source/drain (S/D) layer and a first gate stack at least partially within the first S/D layer, and wherein the one or more second transistor devices includes a second S/D layer and a second gate stack at least partially within the second S/D layer, wherein the first S/D layer and the second S/D layer are co-planar.

* * * * *